United States Patent
Lan

(10) Patent No.: US 10,849,251 B2
(45) Date of Patent: Nov. 24, 2020

(54) LIQUID TRANSFER MODULE AND LIQUID COOLING SYSTEM THEREOF

(71) Applicant: ASIA VITAL COMPONENTS CO., LTD., New Taipei (TW)

(72) Inventor: Wen-Ji Lan, New Taipei (TW)

(73) Assignee: ASIA VITAL COMPONENTS CO., LTD., New Taipei (TW)

( * ) Notice: Subject to any disclaimer, the term of this patent is extended or adjusted under 35 U.S.C. 154(b) by 107 days.

(21) Appl. No.: 16/221,590

(22) Filed: Dec. 17, 2018

(65) Prior Publication Data

US 2020/0196483 A1 Jun. 18, 2020

(51) Int. Cl.
*H05K 7/20* (2006.01)
*G06F 1/20* (2006.01)

(52) U.S. Cl.
CPC .......... *H05K 7/20272* (2013.01); *G06F 1/20* (2013.01); *H05K 7/20281* (2013.01); *G06F 2200/201* (2013.01)

(58) Field of Classification Search
CPC .............. H01L 23/473; H05K 7/20781; H05K 7/20272; H05K 7/20; G06F 1/20; G06F 2220/201
See application file for complete search history.

(56) References Cited

U.S. PATENT DOCUMENTS

| | | | |
|---|---|---|---|
| 2002/0134445 A1* | 9/2002 | Eidsmore | F15B 13/0814 137/884 |
| 2006/0002080 A1* | 1/2006 | Leija | H05K 7/20772 361/679.46 |
| 2013/0025818 A1* | 1/2013 | Lyon | H05K 7/20781 165/11.1 |
| 2016/0242319 A1* | 8/2016 | Edwards | F04D 29/586 |

FOREIGN PATENT DOCUMENTS

| | | |
|---|---|---|
| CN | 108401400 A | 8/2018 |
| TW | M561985 | 6/2018 |
| WO | 1999054665 A1 | 10/1999 |

\* cited by examiner

*Primary Examiner* — Eric S Ruppert
(74) *Attorney, Agent, or Firm* — Demian K. Jackson; Jackson IPG PLLC

(57) ABSTRACT

A liquid transfer module is applied to a liquid cooling system. The liquid transfer module includes a first flow guide body and a second flow guide body removably connected with a liquid reservoir tank and a pump unit. The first and second flow guide bodies are formed with multiple internal flow passages. Some of the flow passages communicate with each other via a check valve and some other flow passages communicate with each other via an opening. The liquid transfer module serves to transfer and guide a working liquid to flow through the liquid reservoir tank and the pump unit.

18 Claims, 16 Drawing Sheets

LIQUID TRANSFER MODULE AND LIQUID COOLING SYSTEM THEREOF

BACKGROUND OF THE INVENTION

1. Field of the Invention

The present invention relates generally to a liquid transfer nodule and a liquid cooling system thereof, and more particularly to a liquid transfer module, which can keep a liquid cooling system continuously operating.

2. Description of the Related Art

In recent years, various liquid cooling systems have been massively applied to high-power heat sources to dissipate the heat thereof. The liquid cooling system has better heat dissipation efficiency so that except the personal desktop computer, the liquid cooling system is also widely selectively applied to industrial computer or server system chassis for dissipating the heat.

The liquid cooling system is mainly composed of a water cooling head, a pump, a liquid reservoir tank and a liquid radiator (or so-called water cooling radiator). The water cooling head is in contact with the heat source to heat-exchange with the heat source so as to transfer the heat of the heat source to a working liquid. The liquid radiator serves to dissipate the heat of the working liquid passing through the water cooling head. After the liquid radiator dissipates the heat of the working liquid, the working liquid is cooled and flows through the liquid reservoir tank and the pump. After a period of time, a certain amount of working liquid circulating within the liquid cooling system will be lost. Therefore, an amount of working liquid is previously filled in the liquid reservoir tank for supplementing the liquid cooling system with the working liquid. The pump serves to drive the working liquid to flow through the liquid cooling system.

However, the above units are serially connected by means of tube bodies for the working liquid to circulate and perform the cooling work. In case one of the units of the liquid cooling system, such as the pump or the liquid reservoir tank fails to normally work, the entire liquid cooling system must stop operating.

SUMMARY OF THE INVENTION

It is therefore a primary object of the present invention to provide a liquid transfer module, which serves to transfer the working liquid between the liquid reservoir tank and the pump unit and the water cooling head and the liquid radiator.

It is a further object of the present invention to provide the above liquid transfer module, which can keep the liquid cooling system continuously operating.

It is still a further object of the present invention to provide the above liquid transfer module, in which at least two pumps are serially connected by means of flow passages to pressurize the working liquid in the liquid cooling system so as to increase the pressure of the working liquid and speed the flowing of the working liquid.

It is still a further object of the present invention to provide a liquid cooling system, in which the components can be detached and replaced with the liquid cooling system continuously operating.

It is still a further object of the present invention to provide a liquid cooling system, in which a liquid transfer module having check valves are used as a relay transfer module.

To achieve the above and other objects, the liquid transfer module of the present invention is connected with a liquid reservoir tank and a pump unit. The liquid transfer module includes: a first flow guide body formed with a first flow guide passage set having multiple flow passages in communication with an inlet and an outlet for a working liquid to flow in and flow out, a check valve being disposed in each of some flow passages of the first flow guide passage set for limiting the flowing direction of the working liquid; and a second flow guide body mated with the first flow guide body, the second flow guide body being formed with a second flow guide passage set having multiple flow passages in communication with the first flow guide passage set, the second flow guide body being further formed with multiple openings respectively in communication with the first flow guide passage set and the second flow guide passage set, the openings being respectively connected to the liquid reservoir tank and the pump unit.

Still to achieve the above and other objects, the liquid cooling system of the present invention includes: a first flow guide body formed with a first flow guide passage set having multiple flow passages in communication with an inlet and an outlet, the inlet being connected with a liquid radiator, the outlet being connected with a water cooling head, a check valve being disposed in each of some flow passages of the first flow guide passage set; a second flow guide body mated with the first flow guide body, the second flow guide body being formed with a second flow guide passage set having multiple flow passages in communication with the first flow guide passage set, the second flow guide body being further formed with multiple openings respectively in communication with the first flow guide passage set and the second flow guide passage set; a liquid reservoir tank connected with the second flow guide body, the liquid reservoir tank having a liquid reservoir tank inlet and a liquid reservoir tank outlet, which respectively communicate with the first and second flow guide bodies via two openings of the second flow guide body; and a pump unit having at least one first pump, the first pump having a first pump inlet and a first pump outlet, which communicate with the flow passages of the second flow guide body via the other two openings of the second flow guide body.

In the above liquid cooling system, the first flow guide body includes a first section and a second section. The first flow guide passage set includes a first flow passage, a second flow passage and a third flow passage disposed on the first section and a fourth flow passage, a fifth flow passage and a sixth flow passage disposed on the second section. The first flow passage is connected with the fourth flow passage via a first check valve. The second flow passage is connected with the fifth flow passage via a second check valve. The third flow passage is connected with the fifth flow passage via a third check valve. The sixth flow passage is connected with the third flow passage via a communication tube. The inlet communicates with the first flow passage. The outlet communicates with the third flow passage.

In the above liquid cooling system, the second flow guide body is mated with the first flow guide body. The second flow guide body includes a third section and a fourth section corresponding to the third section. The second flow guide passage set includes a seventh flow passage and an eighth flow passage disposed between the third section and the fourth section. The multiple openings includes a first opening, a second opening, a third opening, a fourth opening and a fifth opening disposed on the third section and a sixth opening, a seventh opening, an eight opening, a ninth opening, a tenth opening and an eleventh opening disposed on the fourth section.

In the above liquid cooling system, the first and second openings are positioned in a region outside the seventh flow passage and the eighth flow passage. The first opening correspondingly communicates with the first flow passage of the first flow guide body. The second opening correspondingly communicates with the sixth flow passage of the first flow guide body. The third and fourth openings communicate with the seventh flow passage of the second flow guide body and are respectively positioned at two ends of the seventh flow passage. The third opening correspondingly communicates with the second flow passage of the first flow guide body. The fourth opening correspondingly communicates with the fourth flow passage of the first flow guide body. The fifth opening communicates with the eighth flow passage of the second flow guide body and correspondingly communicates with the fifth flow passage of the first flow guide body.

In the above liquid cooling system, the sixth opening correspondingly communicates with the first opening of the third section. The seventh and eighth openings communicate with the seventh flow passage of the third section. The seventh opening corresponds to the second opening of the third section. The ninth and tenth openings communicate with the eighth flow passage and are respectively positioned at two ends of the eighth flow passage. The ninth opening corresponds to the fifth opening of the third section. The eleventh opening correspondingly communicates with the second opening of the third section.

In the above liquid cooling system, the liquid reservoir tank has a liquid reservoir tank inlet and a liquid reservoir tank outlet, which are removably connected with the sixth opening and seventh opening of the second flow guide body via two connectors. The pump unit includes a first pump having a first pump inlet and a first pump outlet, which are removably connected with the eighth opening and tenth opening of the second flow guide body via the two connectors.

In the above liquid cooling system, the pump unit further includes a second pump. The second pump has a second pump inlet and a second pump outlet, which are removably connected with the ninth opening and eleventh opening of the second flow guide body via two connectors.

The above liquid cooling system further includes a detection unit for detecting the amount of the working liquid stored in the liquid reservoir tank and the rotational speed of the pump unit.

In the above liquid cooling system, the openings are respectively connected with the liquid reservoir tank and the pump unit via a connector.

In the above liquid cooling system, each connector is a quick-release connector.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
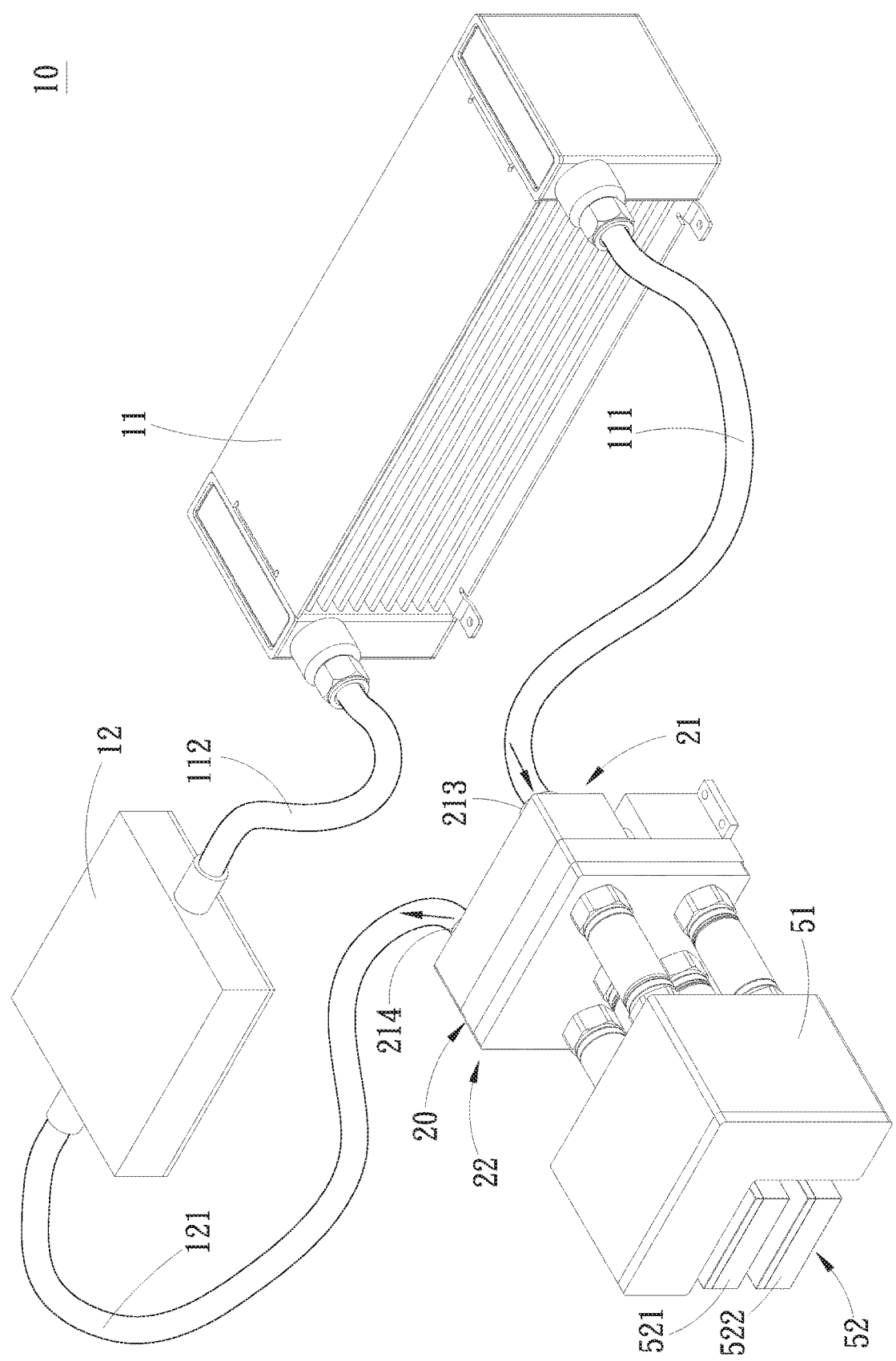
FIG. 1 is a perspective view of the liquid cooling system of the present invention.

Please refer to FIG. 1. The liquid cooling system 10 of the present invention includes a liquid radiator 11 (or so-called water cooling radiator), a water cooling head 12, a liquid reservoir tank 51, a pump unit 52 and a liquid transfer module 20. The liquid radiator 11 is connected to the liquid transfer module 20 via a first conduit 111 and connected to the water cooling head 12 via a second conduit 112. The water cooling head 12 is connected to the liquid transfer module 20 via a third conduit 121. The liquid radiator 11 and the water cooling head 12 communicate with the liquid reservoir tank 51 and the pump unit 52 via the liquid transfer module 20. The pump unit 52 includes at least one pump. In this embodiment, the pump unit 52 includes, but not limited to, two pumps, that is, a first pump 521 and a second pump 522. Alternatively, the pump unit 52 can include only one pump. This will be specifically described hereinafter. The water cooling head 12 is in contact with a heat source to carry away the heat of the heat source by means of a working liquid. The working liquid flows through the second conduit 112 into the liquid radiator 11 to dissipate the heat. The cooled working liquid flows through the first conduit 111 into the liquid transfer module 20 and then flows through the liquid transfer module 20 into the liquid reservoir tank 51 and the pump unit 52. A liquid is previously filled in the liquid reservoir tank 51 for supplementing the liquid cooling system 10 with an amount of liquid. The pump unit 52 serves to drive or pressurize the working liquid in the liquid cooling system 10 to speed the flowing of the working liquid.

The liquid transfer module 20 includes a first flow guide body 21 and a second flow guide body 22 mated with the first flow guide body 21. The first flow guide body 21 is formed with a first flow guide passage set having multiple flow passages in communication with an inlet 213 and an outlet 214 for the working liquid of the liquid cooling system 10 to flow in and flow out. The inlet 213 is connected to the liquid radiator 11 via the first conduit 111. The outlet 214 is connected to the water cooling head 12 via the third conduit 121. The second flow guide body 22 is formed with a second flow guide passage set having multiple flow passages in communication with the first flow guide passage set. In addition, the second flow guide body 22 is formed with multiple openings respectively in communication with the first flow guide passage set and the second flow guide passage set. The openings are respectively connected to the liquid reservoir tank 51 and the pump unit 52.

The liquid transfer module 20 serves as a relay transfer module disposed between the liquid reservoir tank 51 and the pump unit 52 and the water cooling head 12 and the liquid radiator 11. Moreover, when replacing the liquid reservoir tank 51 or at least one pump of the pump unit 52, the liquid transfer module 20 can keep the liquid cooling system 10 continuously operating without stopping operating due to the replacement.

The internal structure of the liquid transfer module 20 will be described in detail hereinafter.

Figure 2A:
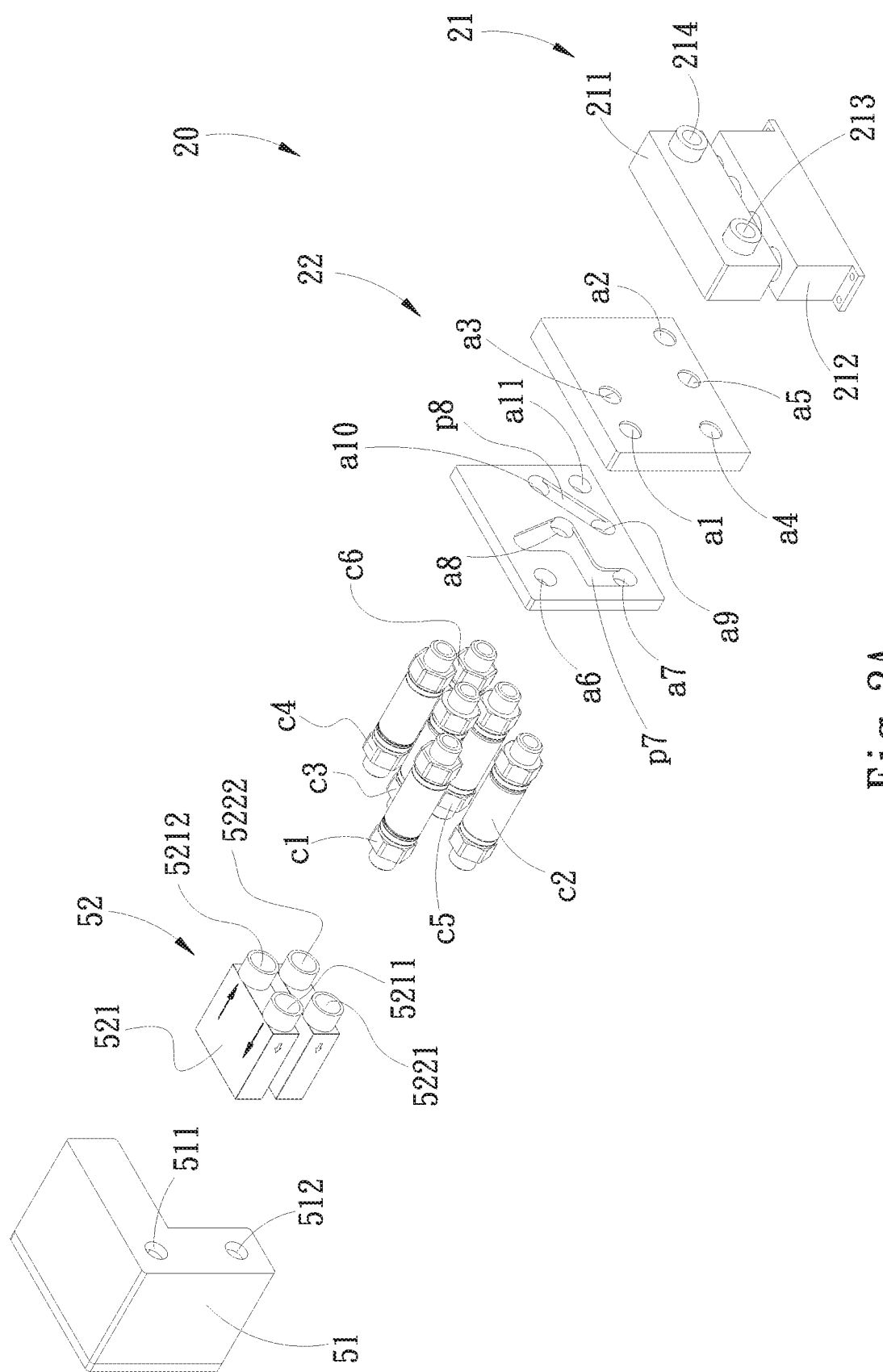
FIG. 2A is a perspective exploded view of the liquid transfer module of the present invention, seen from an angle.
Figure 2B:
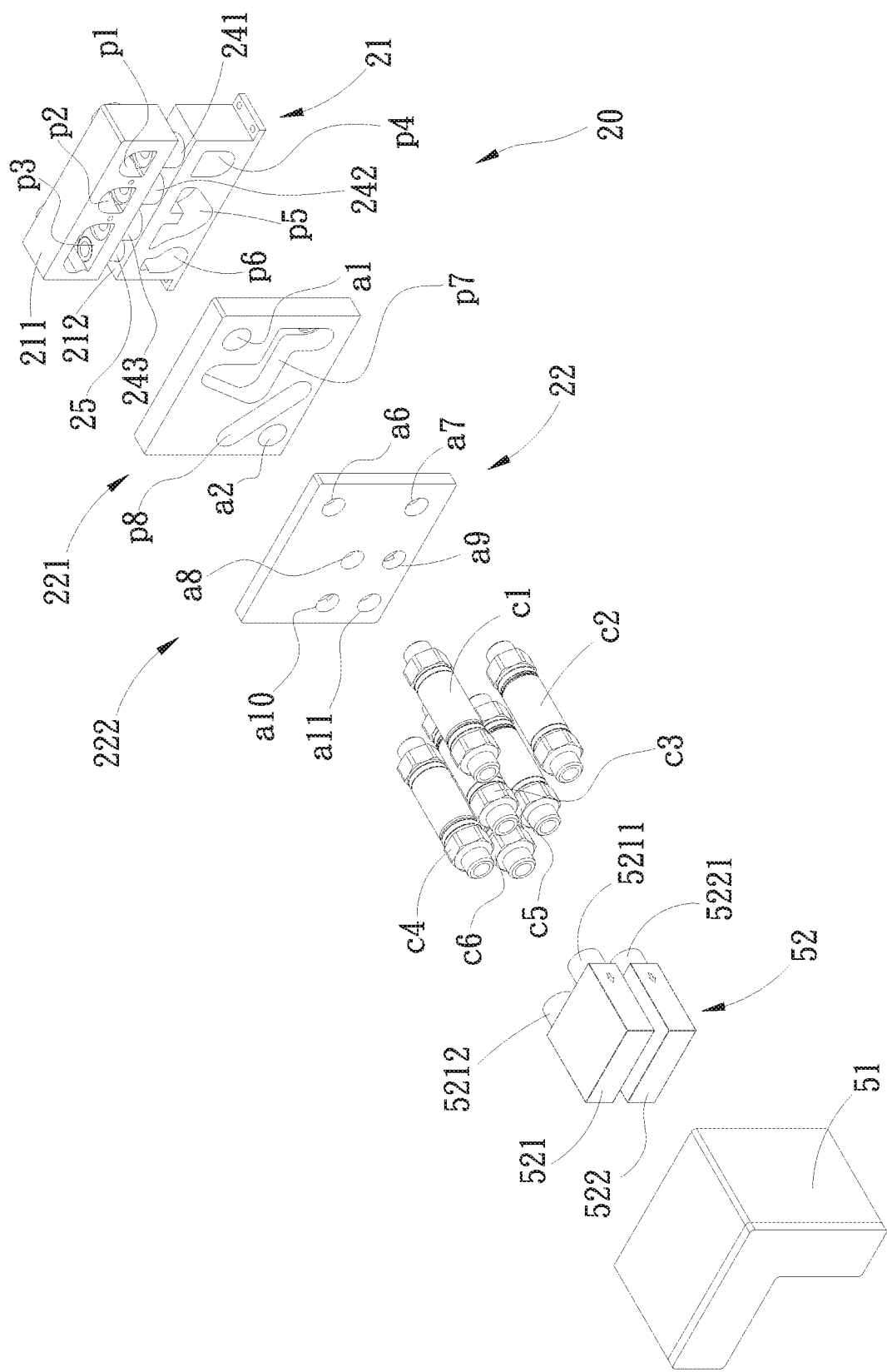
FIG. 2B is a perspective exploded view of the liquid transfer module of the present invention, seen from another angle.

Referring to FIGS. 2A and 2B as well as FIG. 1, the first flow guide body 21 of the liquid transfer module 20 includes a first section 211 and a second section 212, which are up and down arranged. The inlet 213 and the outlet 214 are disposed on the first section 211. The first flow guide passage set is respectively disposed on the first and second sections 211, 212. The second flow guide body 22 includes a third section 221 and a fourth section 222 corresponding to the third section 221. The third section 221 is mated with the first and second sections 211, 212 of the first flow guide body 21. The second flow guide passage set is disposed between the third and fourth sections 222. The multiple openings are respectively disposed on the third and fourth sections 221, 222, wherein the openings positioned on the fourth section 222 serve to connect with the liquid reservoir tank 51 and the pump unit 52.

Figure 3A:
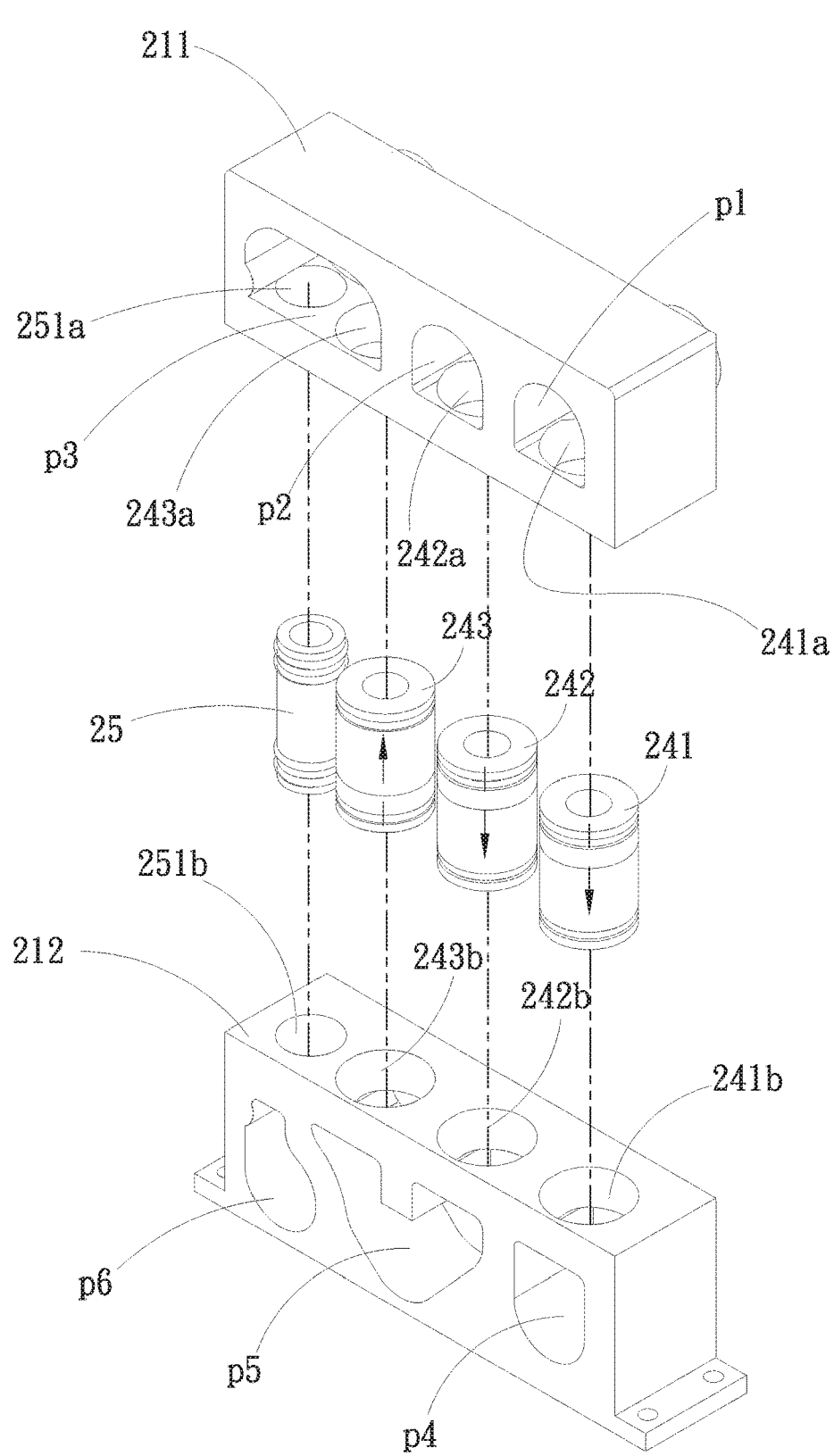
FIG. 3A is a perspective exploded view of the first flow guide body of the present invention.
Figure 3B:
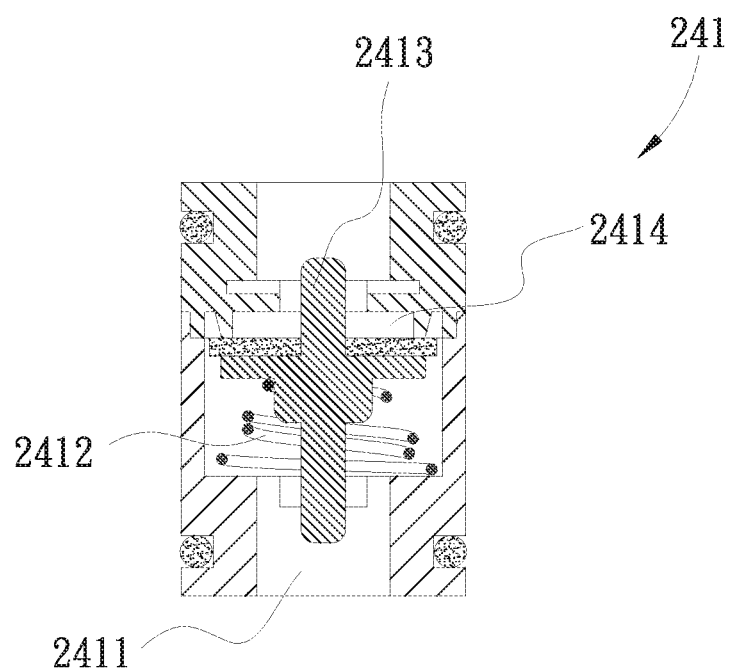
FIG. 3B is a sectional view of the exemplified check valve of the present invention.
Figure 4A:
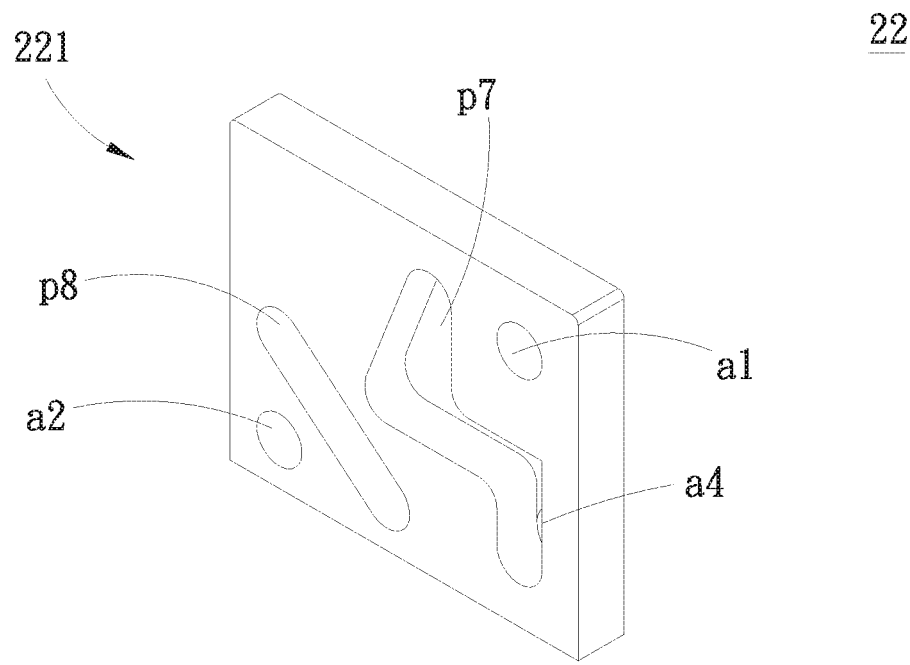
FIGS. 4A to 4D are perspective views showing the second flow guide body of the present invention.
Figure 4B:
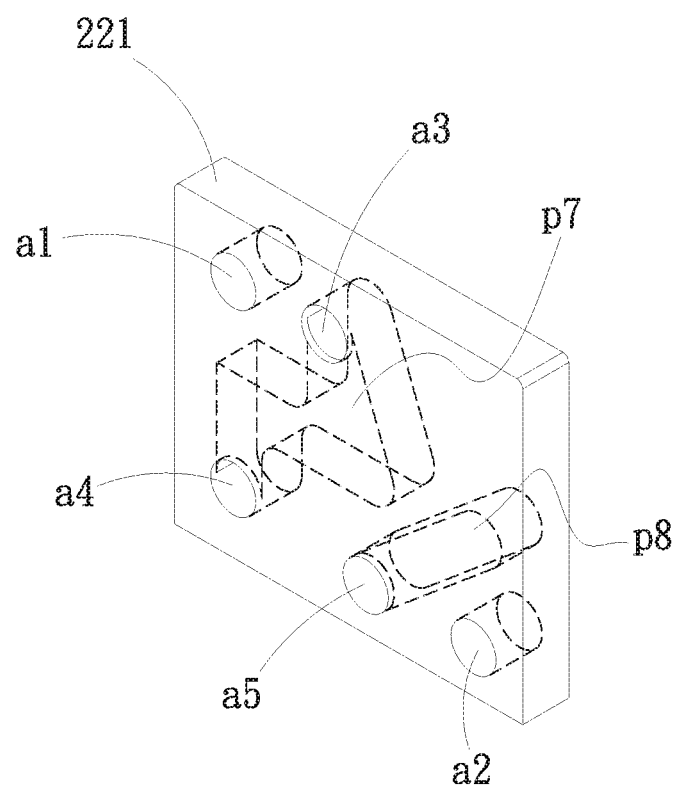
Figure 4C:
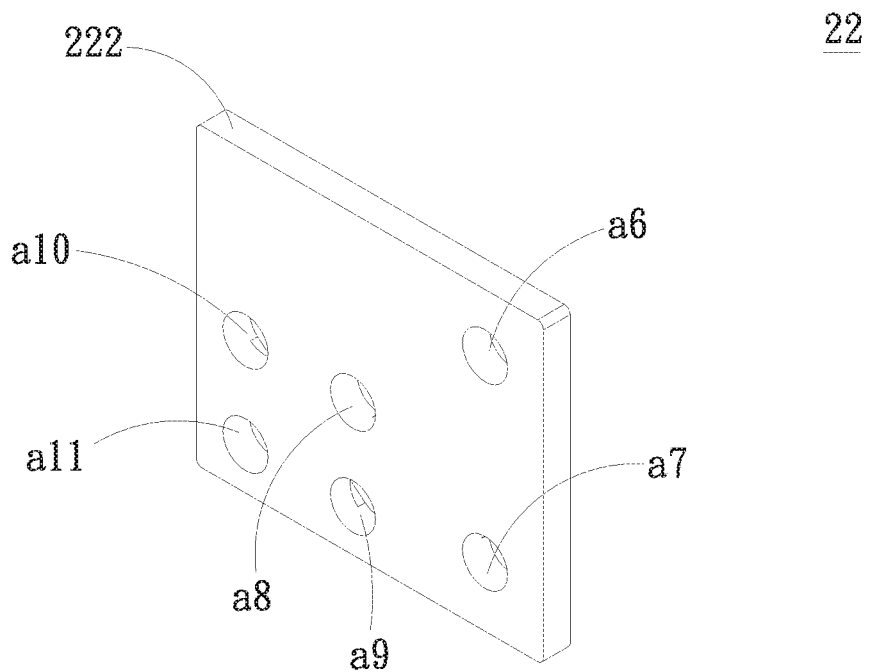
Figure 4D:
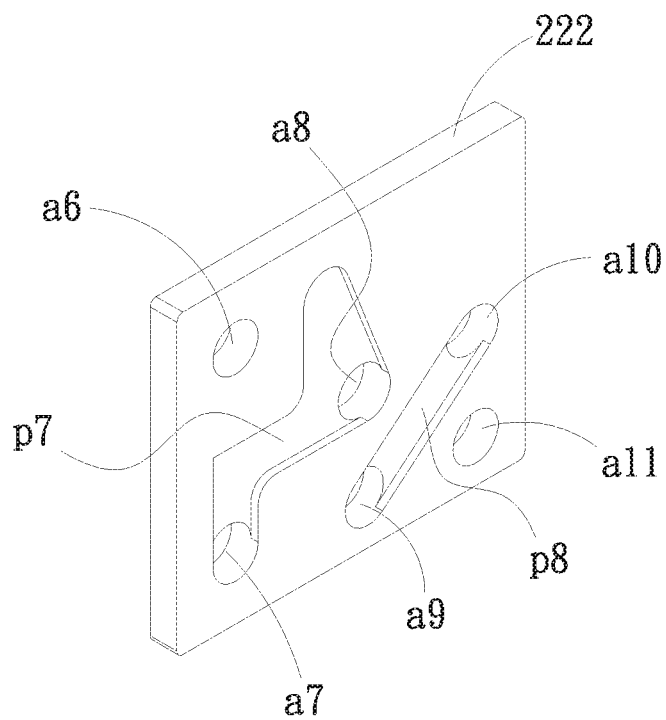

Please further refer to FIGS. 3A and 3B as well as FIGS. 2A and 2B. The first flow guide passage set of the first flow guide body 21 includes a first flow passage p1, a second flow passage p2 and a third flow passage p3 disposed on one side of the first section 211, which side faces the second flow guide body 22 and a fourth flow passage p4, a fifth flow passage p5 and a sixth flow passage p6 disposed on one side of the second section 212, which side faces the second flow guide body 22.

A first check valve 241 is connected with the first flow passage p1 and the fourth flow passage p4. A second check valve 242 is connected with the second flow passage p2 and the fifth flow passage p5. A third check valve 243 is connected with the third flow passage p3 and the fifth flow passage p5. A communication tube 25 is connected with the third flow passage p3 and the sixth flow passage p6.

Furthermore, one side of the first section 211 faces one side of the second section 212. That is, a lower side of the first section 211 faces an upper side of the second section 212. A first valve body upper connection hole 241a and a first valve body lower connection hole 241b are respectively formed on the lower side of the first section 211 and the upper side of the second section 212 in communication with the first flow passage p1 and the third flow passage p3 respectively. A second valve body upper connection hole 242a and a second valve body lower connection hole 242b are respectively formed on the lower side of the first section 211 and the upper side of the second section 212 in communication with the second flow passage p2 and the fifth flow passage p5 respectively. A third valve body upper connection hole 243a and a third valve body lower connection hole 243b are respectively formed on the lower side of the first section 211 and the upper side of the second section 212 in communication with the third flow passage p3 and the fifth flow passage p5 respectively. In addition, a communication tube upper connection hole 251a and a communication tube lower connection hole 251b are respectively formed on the lower side of the first section 211 and the upper side of the second section 212 in communication with the third flow passage p3 and the sixth flow passage p6 respectively.

Two ends of the first check valve 241 are connected with the first valve body upper connection hole 241a and the first valve body lower connection hole 241b. Two ends of the second check valve 242 are connected with the second valve body upper connection hole 242a and the second valve body lower connection hole 242b. Two ends of the third check valve 243 are connected with the third valve body upper connection hole 243a and the third valve body lower connection hole 243b. Two ends of the communication tube 25 are connected with the communication tube upper connection hole 251a and the communication tube lower connection hole 251b.

The first, second and third check valves 241, 242, 243 have directionality for limiting the flowing direction of the liquid. The first and second check valves 241, 242 are directed downward, while the third check valve 243 is directed upward. Moreover, the first, second and third check valves 241, 242, 243 can be common conventional check valves as shown in FIG. 3B. The first, second and third check valves 241, 242, 243 have the same structure so that only the first check valve 241 will be described hereinafter as an example to facilitate illustration. The first check valve 241 is formed with an internal valve body passage 2411 passing through the first check valve 241. An elastic member 2412 is disposed in the valve body passage 2411 and fitted with a valve stein 2413. The valve body passage 2411 has a passage opening 2414 slightly smaller than the valve stein 2413. In normal state, the elastic member 2412 urges the valve stein 2413 to block the passage opening 2414. However, when the working liquid applies a certain pressure to the valve stein 2413, the valve stein 2413 will be displaced to forcedly compress the elastic member 2412 so as to unblock the passage opening 2414. Under such circumstance, the working liquid can pass through the check valve 241.

Please now refer to FIGS. 4A, 4B, 4C and 4D as well as FIGS. 2A and 2B. The second flow guide passage set of the second flow guide body 22 includes a seventh flow passage p7 and an eighth flow passage p8 disposed between the third section 221 and the fourth section 222. The multiple openings include a first opening a1, a second opening a2, a third opening a3, a fourth opening a4 and a fifth opening a5 disposed on the third section 221 and a sixth opening a6, a seventh opening a7, an eight opening a8, a ninth opening a9, a tenth opening a10 and an eleventh opening a11 disposed on the fourth section 222.

The first and second openings a1, a2 of the third section 221 are positioned in a region outside the seventh flow passage p1 and the eighth flow passage p8. The first opening a1 correspondingly communicates with the first flow passage p1 of the first flow guide body 21. The second opening a2 correspondingly communicates with the sixth flow passage p6 of the first flow guide body 21. The third and fourth openings a3, a4 correspondingly communicate with the seventh flow passage p7 of the second flow guide body 22 and are respectively positioned at two ends of the seventh flow passage p7. In addition, the third opening a3 correspondingly communicates with the second flow passage p2 of the first flow guide body 21. The fourth opening a4 correspondingly communicates with the fourth flow passage p4 of the first flow guide body 21. The fifth opening a5 communicates with the eighth flow passage p8 of the second flow guide body 22 and correspondingly communicates with the fifth flow passage p5 of the first flow guide body 21.

Furthermore, the sixth opening a6 of the fourth section 222 correspondingly communicates with the first opening a1 of the third section 221. The seventh and eighth openings a7, a8 communicate with the seventh flow passage p7 of the third section 221. The seventh opening a7 corresponds to the second opening a2 of the third section 221. The ninth and tenth openings a9, a10 communicate with the eighth flow passage p8 and are respectively positioned at two ends of the eighth flow passage p8. The ninth opening a9 corresponds to the fifth opening a5 of the third section 221. The eleventh opening a11 correspondingly communicates with the second opening a2 of the third section 221.

Figure 2C:
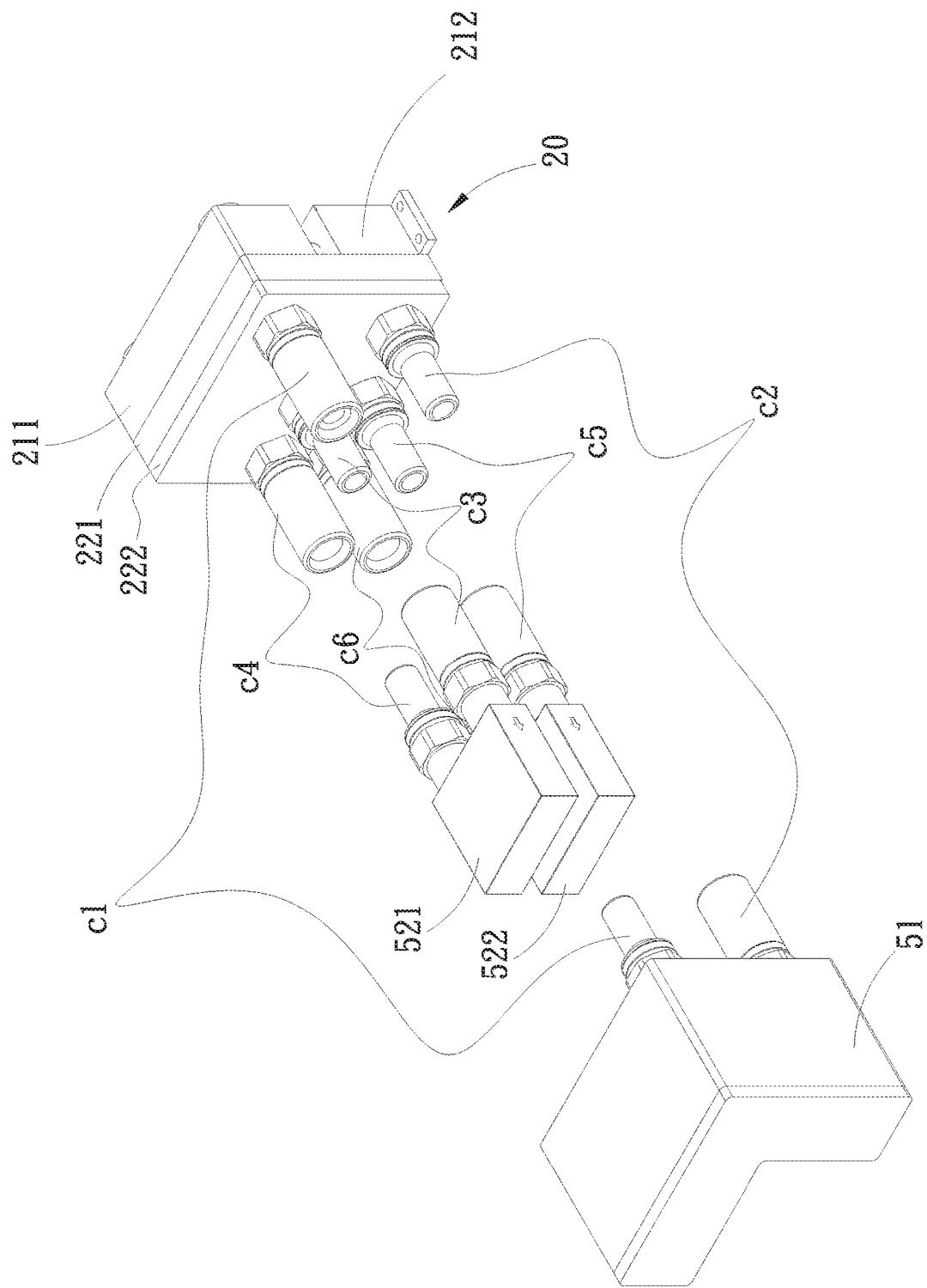
FIG. 2C is a perspective exploded view showing that the female connector and the male connector of the present invention are respectively connected with the liquid transfer module, the water tank and the pump.

Please now refer to FIG. 2C as well as FIGS. 2A and 2B. The multiple connectors c1 to c6 include male connectors and female connectors in adaptation to each other. Any of the male connectors or female connectors of the connectors c1 to c6 are respectively connected with the sixth to eleventh openings a6 to a11 of the fourth section 222 of the second flow guide body 22. The other of the male connectors or female connectors of the connectors c1 to c6 are respectively connected with the liquid reservoir tank 51 and at least one of the pump unit 52. The liquid reservoir tank 51 has a liquid reservoir tank inlet 511 and a liquid reservoir tank outlet 512, which are removably connected with the sixth opening a6 and seventh opening a7 of the second flow guide body 22 via two connectors c1 and c2.

The first pump 521 of the pump unit 52 has a first pump inlet 5211 and a first pump outlet 5212, which are removably connected with the eighth opening a8 and tenth opening a10 of the second flow guide body 22 via two connectors c3 and c4. The second pump 522 has a second pump inlet 5221 and a second pump outlet 5222, which are removably connected with the ninth opening a9 and eleventh opening a11 of the second flow guide body 22 via two connectors c5 and c6. Moreover, by means of the ninth and tenth openings a9, a10 and the eighth flow passage p8, the first pump 521 and the second pump 522 are serially connected. Therefore, when the working liquid sequentially flows through the first pump 521 and the second pump 522, the working liquid is pressurized to increase the pressure of the working liquid and speed the flowing of the working liquid.

Moreover, before the male and female connectors of the connectors c1 and c2 between the liquid reservoir tank 51 and the liquid transfer module 20 are connected, the working liquid in the liquid transfer module 20 will not flow to the liquid reservoir tank 51. Also, before the male and female connectors of the connectors c3 to c6 between the at least one pump of the pump unit 52 and the liquid transfer module 20 are connected, the working liquid in the liquid transfer module 20 will not flow to the pump unit 52. The structure and operation of the connectors c1 to c6 will be described in detail hereinafter.

The flow of the working liquid passing through the liquid transfer module 20 will be described hereinafter. In order to clearly illustrate the flow, the components in the drawings are exploded and the flowing paths of the working liquid are denoted by different arrows and line forms. However, in actual use of the present invention, the components are connected with each other as shown in FIG. 1.

Figure 5A:
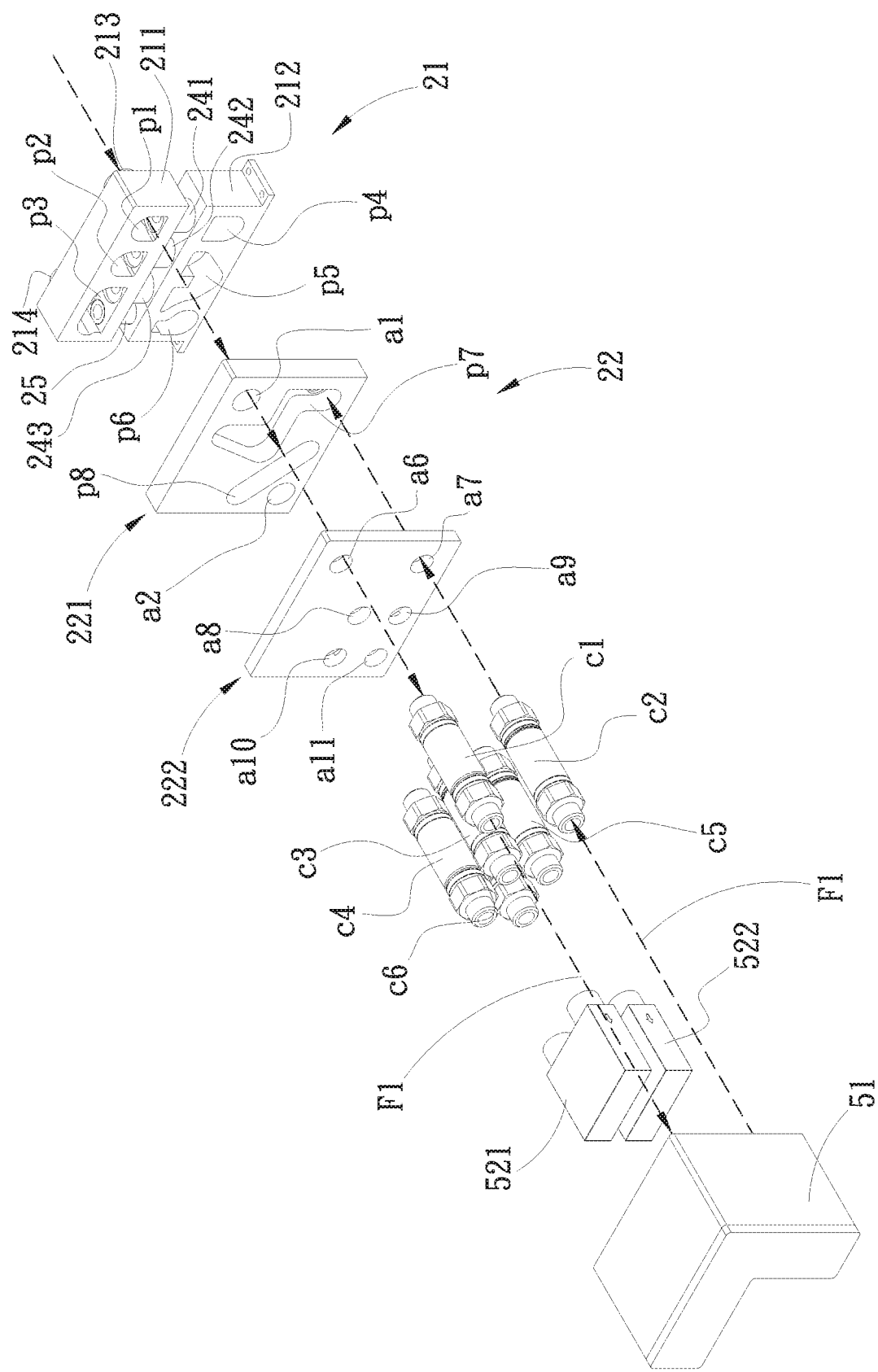
FIGS. 5A to 8 are perspective views showing the flowing paths of the fluid of the respective embodiments of the present invention.
Figure 5B:
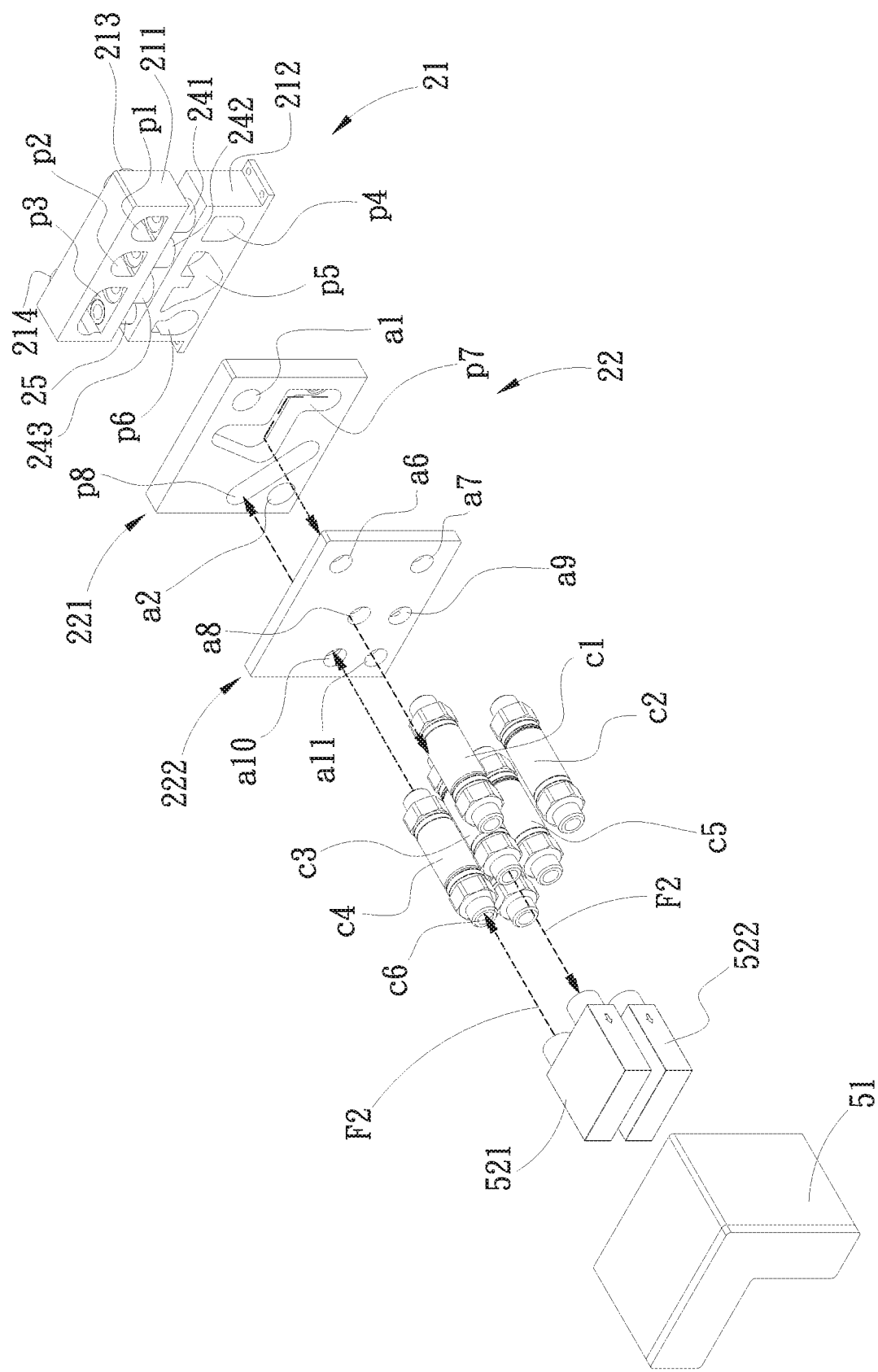
Figure 5C:
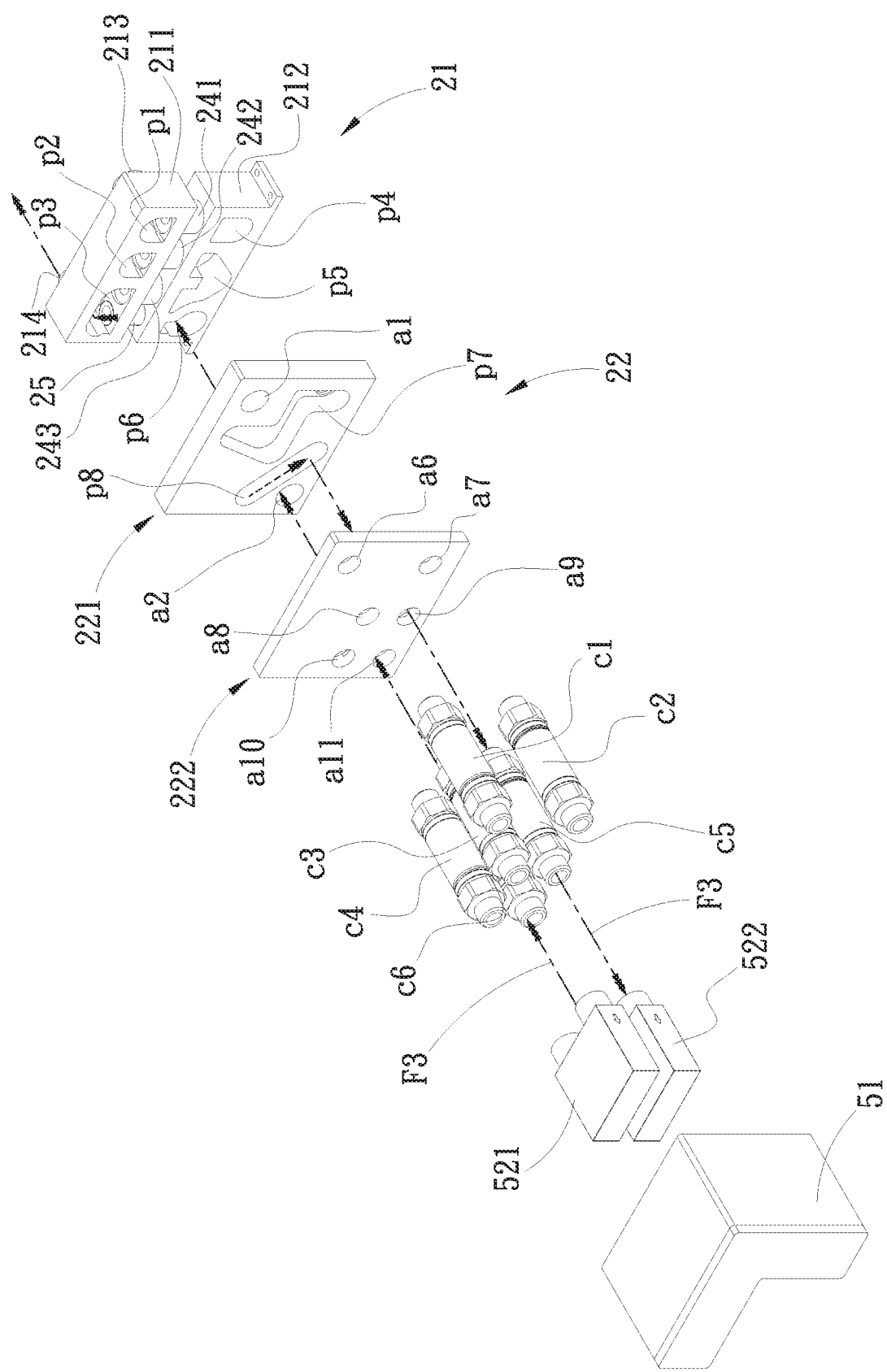

Please further refer to FIGS. 5A to 5C. In a preferred embodiment, the liquid transfer module 20 is connected with the liquid reservoir tank 51 and the first and second pumps 521, 522 of the pump unit 52. The working liquid flows from the inlet 213 into the liquid transfer module 20. First, the working liquid flows through the liquid reservoir tank 51 into the seventh flow passage p7 in the first flowing path F1 (as shown in FIG. 5A). Then, the working liquid flows through the first pump 521 into the eighth flow passage p8 along the seventh flow passage p7 in the second flowing path F2 (as shown in FIG. 5B). Then, the working liquid flows through the second pump 522 into the sixth flow passage p6 along the eighth flow passage p8 in the third flowing path F3 and then flows through the third flow passage p3 out of the outlet 241 (as shown in FIG. 5C).

Figure 6:
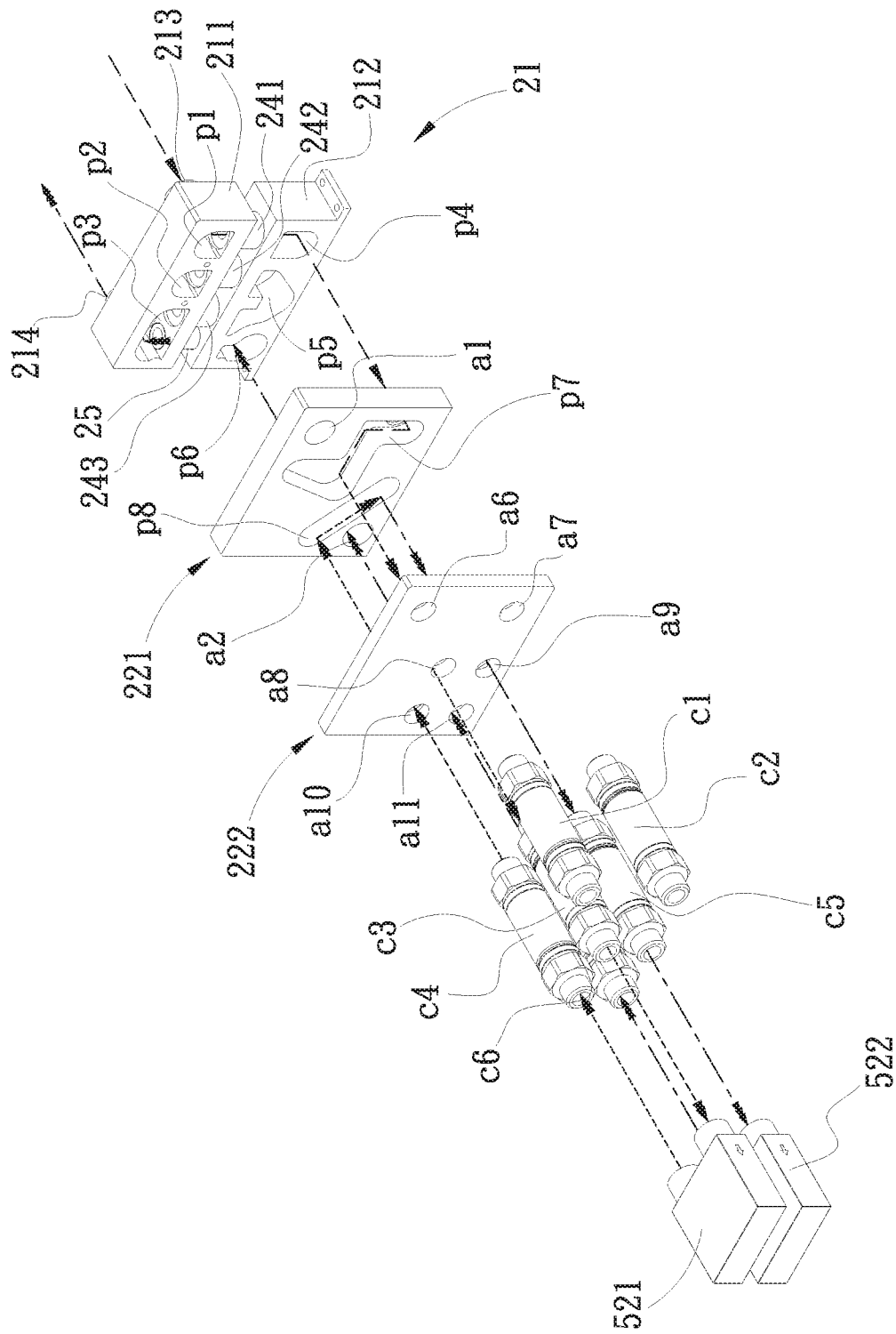

Furthermore, as shown in FIG. 6, in a preferred embodiment, in the case that the liquid reservoir tank 51 is not connected with the liquid transfer module 20, the working liquid flows into the inlet 213 and then downward passes the first check valve 241 along the first flow passage 231. Then, the working fluid flows from the fourth opening a4 into the seventh flow passage p7 and then flows from the seventh flow passage p7 through the eighth opening a8 through the connector c3 into the first pump 521. Then, the working liquid flows out of the first pump 521 through the connector c4 and the tenth opening a10 into the eighth flow passage p8 and then flows from the ninth opening a9 through the connector c5 into the second pump 522. Then, the working liquid flows out of the second pump 522 through the connector c6 and the eleventh opening a11 and the second opening a2 and then flows through the communication tube 25 and the third flow passage p3 along the sixth flow passage p6 and then flows out of the outlet 214.

Figure 7:
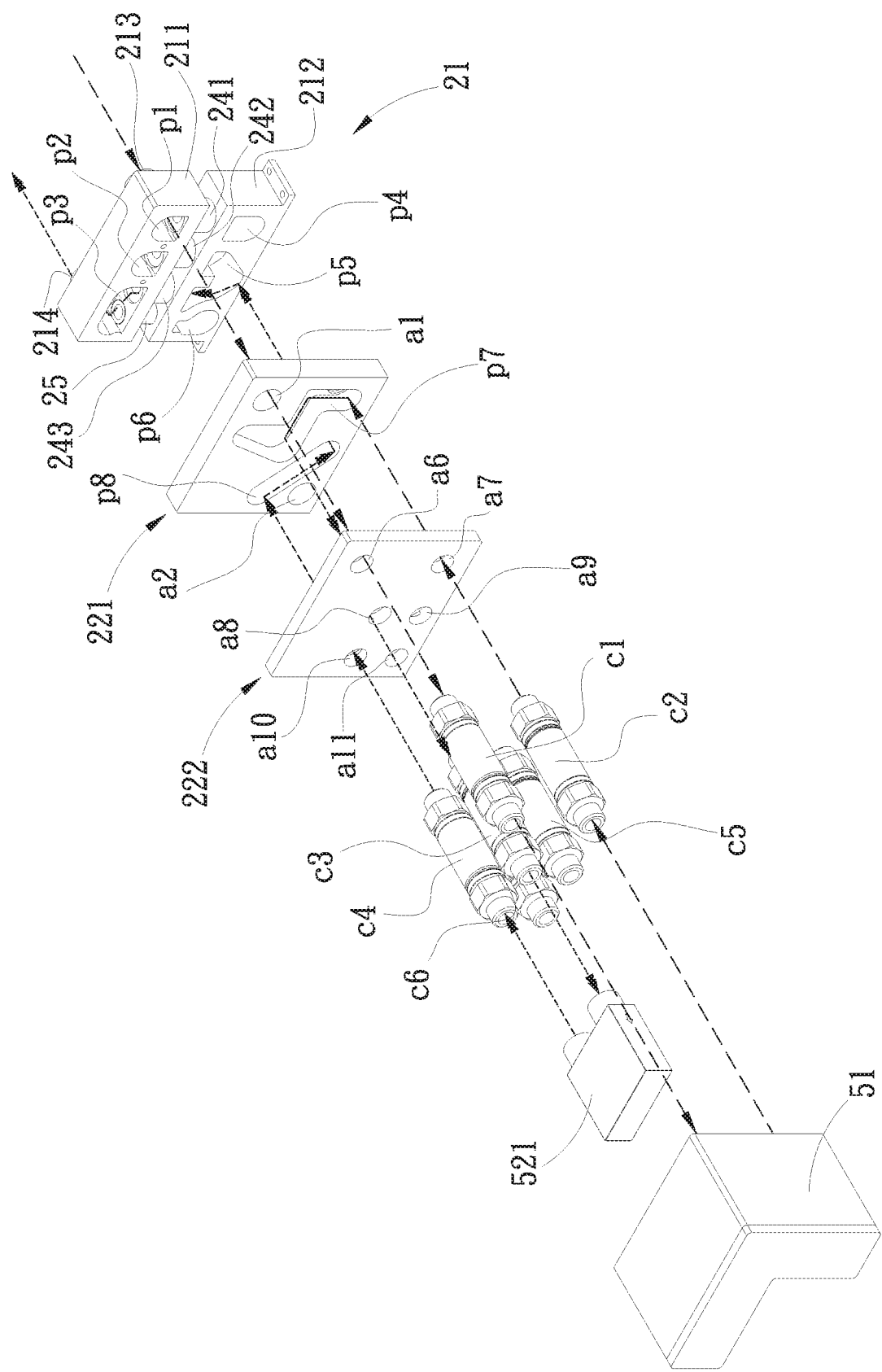
Figure 8:
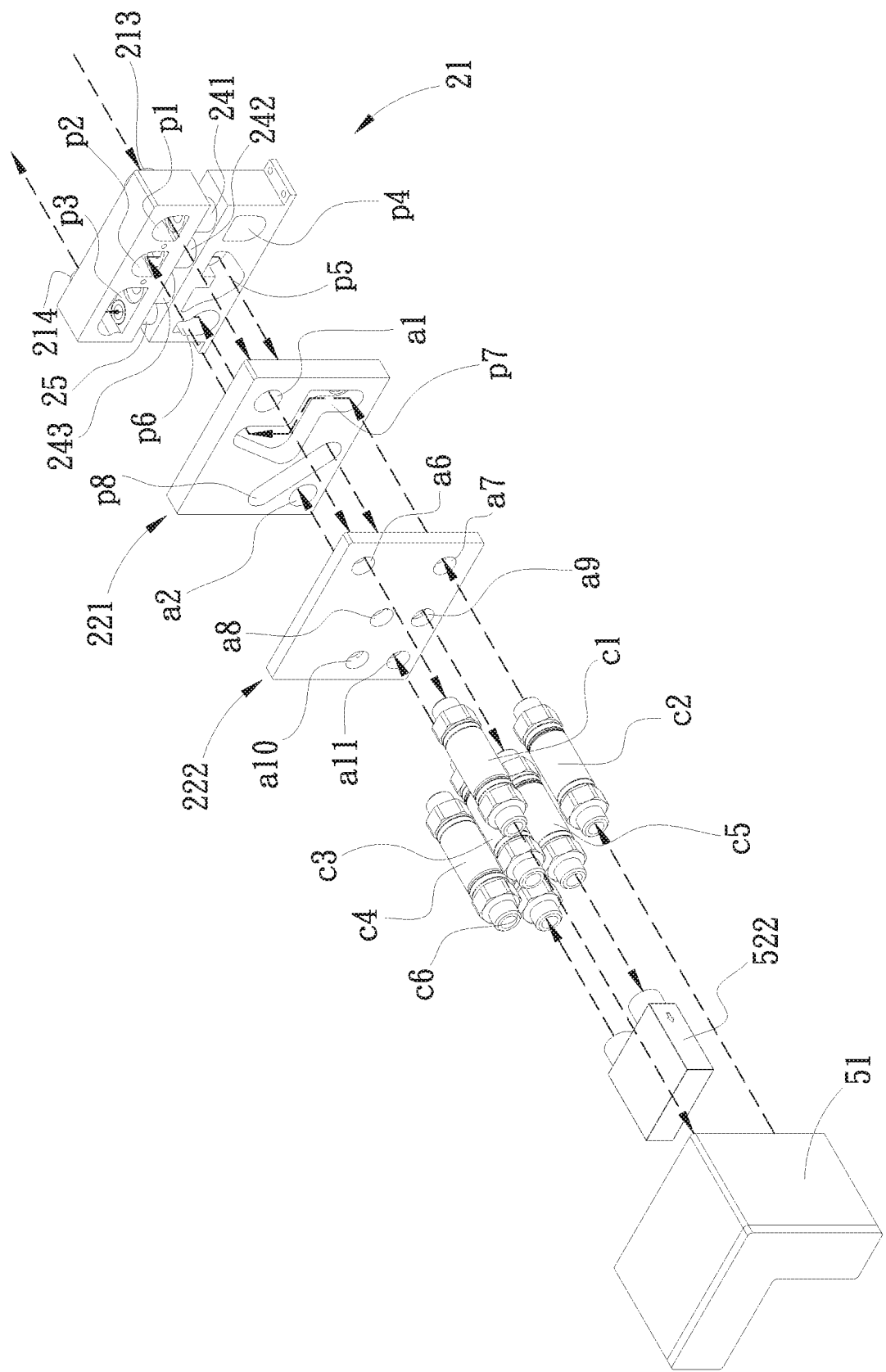

Furthermore, referring FIGS. 7 and 8, in the case that only one pump of the pump unit is connected with the liquid transfer module 20, for example, only the first pump 521 of the pump unit is connected with the liquid transfer module 20 as shown in FIG. 7, after the working liquid flows into the liquid transfer module 20 from the inlet 213, the working liquid flows through the first flow passage p1, the first opening a1, the sixth opening a6 and the connector c1 into the liquid reservoir tank 51. Then, the working liquid flows out of the liquid reservoir tank 51 through the connector c2 and the seventh opening a7 and then flows along the seventh flow passage p7 through the eighth opening a8 and the connector c3 into the first pump 521. Then, the working liquid flows out of the first pump 521 through the tenth opening a10 and then flows along the eighth flow passage p8 through the fifth opening a5 and then flows along the fifth flow passage p5 and the third check valve 243 through the third flow passage p3 and then flows out of the outlet 241.

As shown in FIG. 8, in another case that only the second pump 522 of the pump unit 52 is connected with the liquid transfer module 20, after the working liquid flows into the liquid transfer module 20 from the inlet 213, the working liquid flows through the first flow passage p1, the first opening a1, the sixth opening a6 and the connector c1 into the liquid reservoir tank 51. Then, the working liquid flows out of the liquid reservoir tank 51 through the connector c2 and the seventh opening a7 and then flows along the seventh flow passage p7 through the third opening a3 and then flows along the second flow passage p2 and the second check valve 242 into the fifth flow passage p5. Then the working liquid flows from the fifth flow passage p5 through the fifth opening a5 and the ninth opening a9 and the connector c5 into the second pump 522. Then, the working liquid flows out of the second pump 522 along the connector c6 and the eleventh opening a11 and the second opening a2 into the sixth flow passage p6. Then the working liquid flows along the communication tube 25 and the third flow passage p3 to flow out of the outlet 214.

Figure 9A:
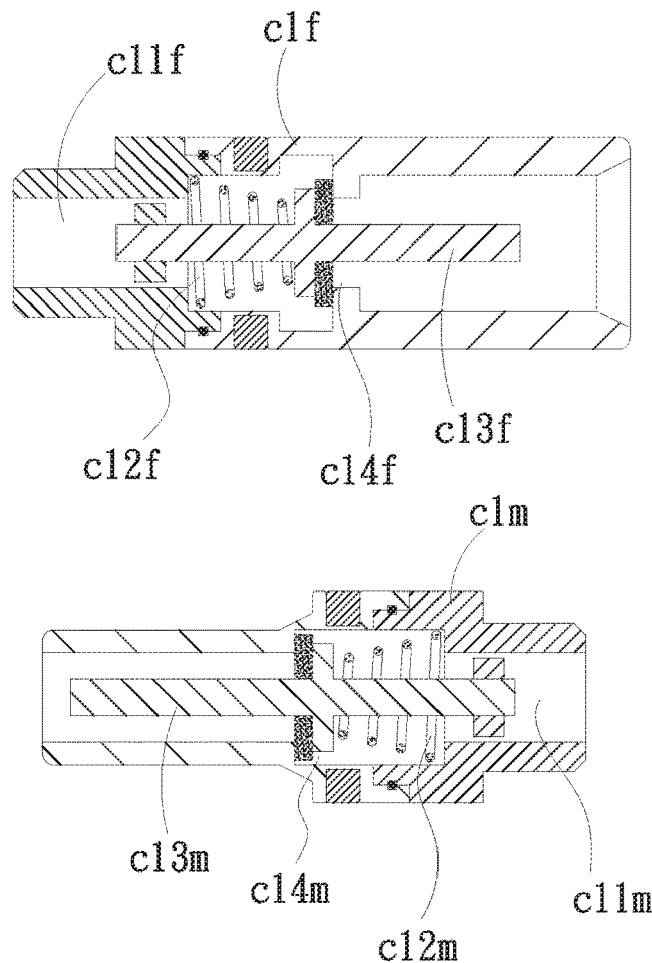
FIGS. 9A and 9B are sectional views showing the exemplified connector of the present invention.
Figure 9B:
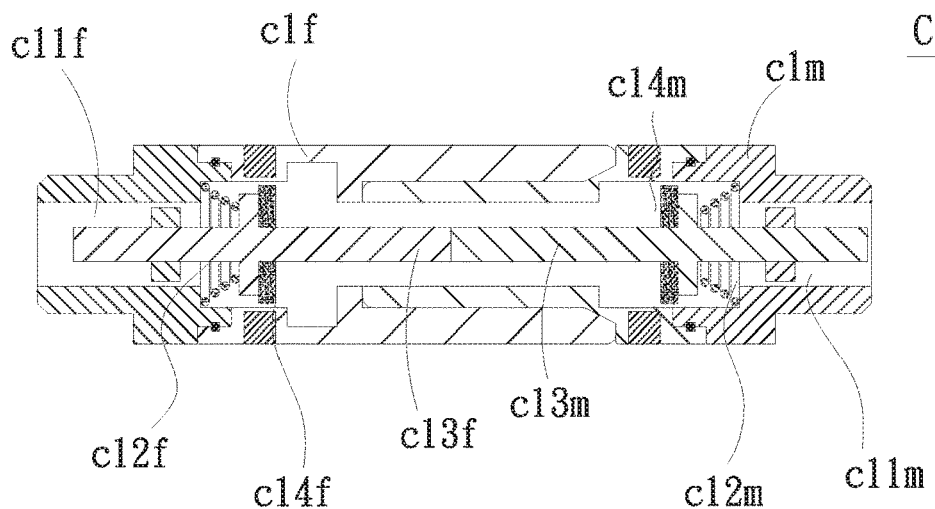

Please further refer to FIGS. 9A and 9B. The aforesaid connectors c1 to c6 are such as the common quick-release connectors. The connectors c1 to c6 have the same structure so that only the connector c1 will be described hereinafter as an example to facilitate illustration. The connector c1 includes a female connector c1f and a male connector c1m.

The female connector c1f has a female connector passage c11f passing through the female connector c1f. A female connector elastic member c12f is disposed in the female connector passage c11f and fitted with a female connector plunger c13f. The female connector passage c11f has a female connector passage opening c14f with a diameter slightly smaller than the diameter of the female connector plunger c13f. When not mated with the male connector c1m, the female connector elastic member c12f urges the female connector plunger c13f to block the female connector passage opening c14f.

The male connector c1m has a male connector passage c11m passing through the male connector c1m and coaxial with the female connector passage c11f. A male connector elastic member c12m is disposed in the male connector passage c11m and fitted with a male connector plunger c13m coaxial with the female connector plunger c13f. The male connector passage c11m has a male connector passage opening c14m with a diameter slightly smaller than the diameter of the male connector plunger c13m. When not mated with the female connector c1f, the male connector elastic member c12m urges the male connector plunger c13m to block the male connector passage opening c14m.

Therefore, before the female connector c1f is fitted with the male connector c1m, the flowing path of the working liquid is interrupted. However, after the female connector c1f is fitted with the male connector c1m, the female connector plunger c13f and the male connector plunger c13m interact with each other and are displaced, whereby the female connector elastic member c12f and the male connector elastic member c12m are forcedly compressed and retreated to unblock the female connector passage opening c14f and the male connector passage opening c14m. Under such circumstance, the working liquid can flow through the female connector passage c11f and the male connector passage c11m. In this embodiment, the male connector dim of the connector c1 is connected with the liquid reservoir tank 51, while the female connector c1f is connected with the sixth opening a6 of the liquid transfer module 20 (as shown in FIGS. 2A to 2C).

Figure 10:
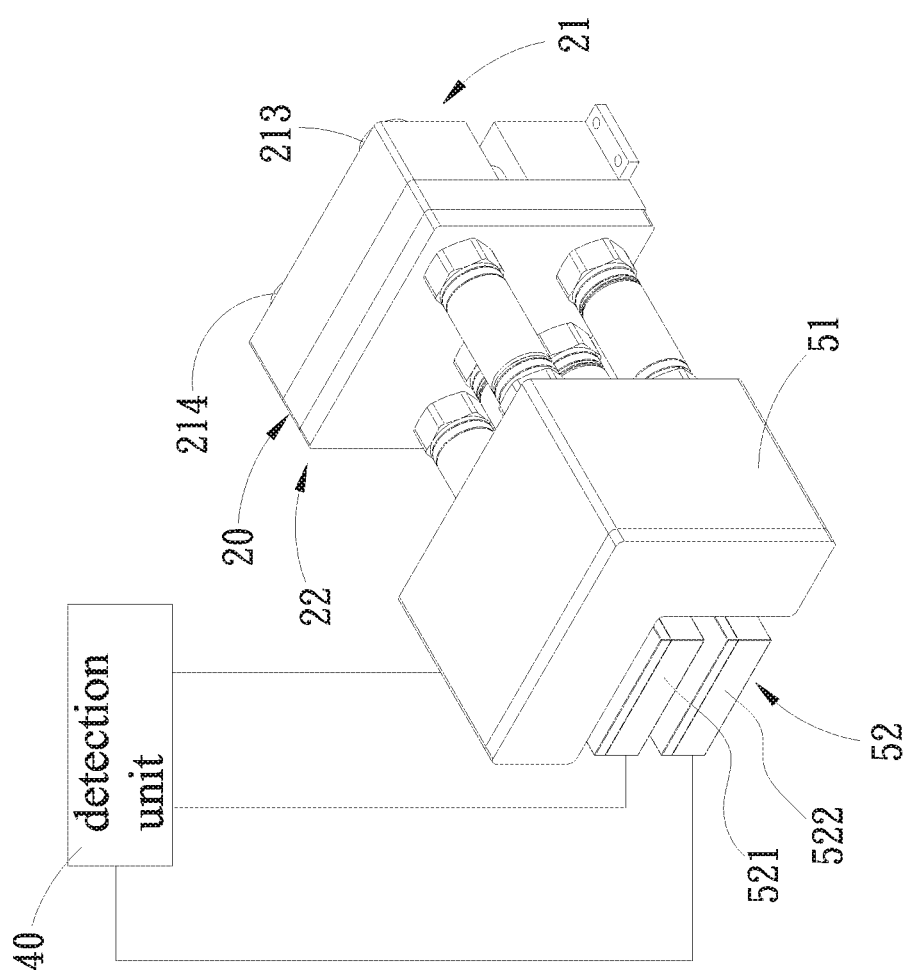
FIG. 10 is a diagram showing that the present invention includes a detection unit.

Please further refer to FIG. 10. A detection unit 40 serves to detect the amount of the working liquid stored in the liquid reservoir tank 51 so as to monitor whether the amount of the stored working liquid is reduced to a preset low value. In case the amount of the working liquid stored in the liquid reservoir tank 51 reaches the preset low value, the liquid reservoir tank 51 is detached and replaced with a new one. Moreover, the detection unit 40 also serves to detect the rotational speed of the pump unit 52. For example, the detection unit 40 can detect the rotational speed of the first pump 521 and/or the second pump 522 so as to monitor whether the first pump 521 and/or the second pump 522 operate normally. In case the first pump 521 or the second pump 522 fails to operate normally, for example, the rotational speed is lower than the normal rotational speed or is zero, the abnormal pump can be detached and replaced with a new one.

According to the above arrangement, the liquid transfer module 20 of the present invention is applied to the liquid cooling system 10 as a relay transfer module disposed between the liquid reservoir tank 51 and the pump unit 52 and the water cooling head 12 and the liquid radiator 11. When replacing the liquid reservoir tank 51, the liquid transfer module 20 can keep the liquid cooling system 10 continuously operating. Moreover, the liquid transfer module 20 of the present invention can be selectively connected with two or more than two pumps or only connected with one pump. That is, the liquid transfer module 20 can be connected with both the first and second pumps 521, 522 or simply connected with one of the first and second pumps 521, 522. Therefore, in case any of the first and second pumps 521, 522 fails to normally operate, the liquid cooling system can keep continuously operating. Moreover, when detaching and replacing one of the first and second pumps 521, 522, the liquid cooling system can keep continuously operating. Furthermore, at least the first and second pumps 521, 522 are serially connected by means of the flow passages so that the working liquid can be pressurized to increase the pressure of the fluid and speed the flowing of the working liquid.

The present invention has been described with the above embodiments thereof and it is understood that many changes and modifications in such as the form or layout pattern or practicing step of the above embodiments can be carried out without departing from the scope and the spirit of the invention that is intended to be limited only by the appended claims.

What is claimed is:

1. A liquid transfer module connected with a liquid reservoir tank and a pump unit, the liquid transfer module comprising:
    a first flow guide body formed with a first and second section and with a first flow guide passage set having a first flow passage, a second flow passage, and a third flow passage disposed on the first section and with a fourth flow passage, a fifth flow passage, and a sixth flow passage disposed on the second section, the first flow passage being connected with the fourth flow passage via a first check valve, the second flow passage being connected with the fifth flow passage via a second check valve, the third flow passage being connected with the fifth flow passage via a third check valve, the sixth flow passage being connected with the third flow passage via a communication tube, an inlet communicating with the first flow passage, and an outlet communicating with the third flow passage; and
    a second flow guide body mated with the first flow guide body, the second flow guide body being formed with a second flow guide passage set having multiple flow passages in communication with the first flow guide passage set, the second flow guide body being further formed with multiple openings respectively in communication with the first flow guide passage set and the second flow guide passage set, the multiple openings being respectively connected to the liquid reservoir tank and the pump unit.

2. The liquid transfer module as claimed in claim 1, wherein the second flow guide body is mated with the first flow guide body, the second flow guide body including a third section and a fourth section corresponding to the third section, the second flow guide passage set including a seventh flow passage and an eighth flow passage disposed between the third section and the fourth section, the multiple openings including a first opening, a second opening, a third opening, a fourth opening, a fifth opening disposed on the third section a sixth opening, a seventh opening, an eight opening, a ninth opening, a tenth opening, and an eleventh opening disposed on the fourth section.

3. The liquid transfer module as claimed in claim 2, wherein the first and second openings are positioned in a region outside the seventh flow passage and the eighth flow passage, the first opening correspondingly communicating with the first flow passage of the first flow guide body, the second opening correspondingly communicating with the sixth flow passage of the first flow guide body, the third and fourth openings communicating with the seventh flow passage of the second flow guide body and being respectively positioned at two ends of the seventh flow passage, the third opening correspondingly communicating with the second flow passage of the first flow guide body, the fourth opening correspondingly communicating with the fourth flow passage of the first flow guide body, the fifth opening communicating with the eighth flow passage of the second flow guide body and correspondingly communicating with the fifth flow passage of the first flow guide body.

4. The liquid transfer module as claimed in claim 3, wherein the sixth opening correspondingly communicates with the first opening of the third section, the seventh and eighth openings communicating with the seventh flow passage of the third section, the seventh opening corresponding to the second opening of the third section, the ninth and tenth openings communicating with the eighth flow passage and being respectively positioned at two ends of the eighth flow passage, the ninth opening corresponding to the fifth opening of the third section, the eleventh opening correspondingly communicating with the second opening of the third section.

5. The liquid transfer module as claimed in claim 4, wherein the liquid reservoir tank has a liquid reservoir tank inlet and a liquid reservoir tank outlet, which are removably connected with the sixth opening and seventh opening of the second flow guide body via two connectors, the pump unit including a first pump, the first pump having a first pump inlet and a first pump outlet, which are removably connected with the eighth opening and tenth opening of the second flow guide body via the two connectors.

6. The liquid transfer module as claimed in claim 5, wherein the pump unit further includes a second pump, the second pump having a second pump inlet and a second pump outlet, which are removably connected with the ninth opening and eleventh opening of the second flow guide body via two connectors.

7. The liquid transfer module as claimed in claim 1, further comprising a detection unit for detecting the amount of the working liquid stored in the liquid reservoir tank and the rotational speed of the pump unit.

8. The liquid transfer module as claimed in claim 1, wherein a first connector is connected between one of the multiple openings and the liquid reservoir tank and a second connector is connected between another of the multiple openings and the pump unit.

9. A liquid cooling system comprising:
a liquid transfer module including:
a first flow guide body formed with a first and second section and with a first flow guide passage set including a first flow passage, a second flow passage, and a third flow passage disposed on the first section and a fourth flow passage, a fifth flow passage, and a sixth flow passage disposed on the second section, an inlet connected with a liquid radiator and the first flow passage, and an outlet connected with a water cooling head and the third flow passage, the first flow passage being connected with the fourth flow passage via a first check valve, the second flow passage being connected with the fifth flow passage via a second check valve, the third flow passage being connected with the fifth flow passage via a third check valve, the sixth flow passage being connected with the third flow passage via a communication tube and
a second flow guide body mated with the first flow guide body, the second flow guide body being formed with a second flow guide passage set having multiple flow passages in communication with the first flow guide passage set, the second flow guide body being further formed with multiple openings respectively in communication with the first flow guide passage set and the second flow guide passage set;
liquid reservoir tank connected with the second flow guide body, the liquid reservoir tank having a liquid reservoir tank inlet and a liquid reservoir tank outlet, which respectively communicate with the first and second flow guide bodies via two of the multiple openings of the second flow guide body; and
a pump unit having at least one first pump, the first pump having a first pump inlet and a first pump outlet, which communicate with the flow passages of the second flow guide body via a different two of the multiple openings of the second flow guide body.

10. The liquid cooling system as claimed in claim 9, wherein the second flow guide body is mated with the first flow guide body, the second flow guide body including a third section and a fourth section corresponding to the third section, the second flow guide passage set including a seventh flow passage and an eighth flow passage disposed between the third section and the fourth section, the multiple openings including a first opening, a second opening, a third opening, a fourth opening and a fifth opening disposed on the third section and a sixth opening, a seventh opening, an eight opening, a ninth opening, a tenth opening and an eleventh opening disposed on the fourth section.

11. The liquid cooling system as claimed in claim 10, wherein the first and second openings are positioned in a region outside the seventh flow passage and the eighth flow passage, the first opening correspondingly communicating with the first flow passage of the first flow guide body, the second opening correspondingly communicating with the sixth flow passage of the first flow guide body, the third and fourth openings communicating with the seventh flow passage of the second flow guide body and being respectively positioned at two ends of the seventh flow passage, the third opening correspondingly communicating with the second flow passage of the first flow guide body, the fourth opening correspondingly communicating with the fourth flow passage of the first flow guide body, the fifth opening communicating with the eighth flow passage of the second flow guide body and correspondingly communicating with the fifth flow passage of the first flow guide body.

12. The liquid cooling system as claimed in claim 11, wherein the sixth opening correspondingly communicates with the first opening of the third section, the seventh and eighth openings communicating with the seventh flow passage of the third section, the seventh opening corresponding to the second opening of the third section, the ninth and tenth openings communicating with the eighth flow passage and being respectively positioned at two ends of the eighth flow passage, the ninth opening corresponding to the fifth opening of the third section, the eleventh opening correspondingly communicating with the second opening of the third section.

13. The liquid cooling system as claimed in claim 12, wherein the liquid reservoir tank is removably connected with the sixth opening and seventh opening of the fourth section of the second flow guide body via two connectors, the first pump of the pump unit being removably connected with the eighth opening and tenth opening of the fourth section of the second flow guide body via two connectors.

14. The liquid cooling system as claimed in claim 13, wherein the pump unit has a second pump, the second pump having a second pump inlet and a second pump outlet, which are removably connected with the ninth opening and eleventh opening of the fourth section of the second flow guide body via two connectors.

15. The liquid cooling system as claimed in claim 9, wherein the multiple openings of the second flow guide body are respectively connected with the liquid reservoir tank and with the pump unit via a respective connector.

16. The liquid cooling system as claimed in claim 14, wherein each connector is a quick-release connector.

17. The liquid cooling system as claimed in claim 15, wherein each respective connector is a quick-release connector.

18. The liquid cooling system as claimed in claim 9, further comprising a detection unit for detecting the amount of the working liquid stored in the liquid reservoir tank and the rotational speed of the pump unit.

\* \* \* \* \*